United States Patent
Nygren et al.

(10) Patent No.: US 6,850,114 B2
(45) Date of Patent: Feb. 1, 2005

(54) PRE-DISTORTION OF NON-LINEAR DEVICES BY POST-DETECTION

(75) Inventors: Thorsten Nygren, Täby (SE); Leonard Rexberg, Hässelby (SE); Bernt Johansson, Kista (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/450,032

(22) PCT Filed: Nov. 28, 2001

(86) PCT No.: PCT/SE01/02628

§ 371 (c)(1),
(2), (4) Date: Jun. 10, 2003

(87) PCT Pub. No.: WO02/49207

PCT Pub. Date: Jun. 20, 2002

(65) Prior Publication Data

US 2004/0032297 A1 Feb. 19, 2004

(30) Foreign Application Priority Data

Dec. 13, 2000 (SE) .............................................. 0004609

(51) Int. Cl.[7] .............................................. H03F 1/26
(52) U.S. Cl. ...................................... 330/149; 375/297
(58) Field of Search ................................ 330/149, 151; 375/297; 455/63

(56) References Cited

U.S. PATENT DOCUMENTS 6,016,076 A * 1/2000 Arell ........................... 330/149
6,075,412 A * 6/2000 Bainvoll ...................... 330/149
6,396,327 B1 * 5/2002 Lam ............................ 327/317

OTHER PUBLICATIONS

Ghaderi et al, "Adaptive Predistortion Lineariser Using Polynomial Functions", IEE Proceedings Communications, Apr. 2, 1994, vol. 141, No. 2, pp. 1526–1528.
Ghaderi et al, "Fast Adaptive Predistortion Lineariser Using Polynomial Functions", Electronic Letters, Aug. 19, 1993, vol. 29, No. 17, pp. 49–55.
International Search Report mail Mar. 26, 2003 in corresponding PCT application PCT/SE01/02628.
International Preliminary Examination Report mailed Oct. 23, 2002 in corresponding PCT application PCT/SE01/02628.

* cited by examiner

Primary Examiner—Henry Choe
(74) Attorney, Agent, or Firm—Nixon & Vanderhye, P.C.

(57) ABSTRACT

A method and an arrangement is disclosed for linearizing the output signal from an inherently non-linear device, e.g. an amplifier, producing intermodulation or non-linear products. A pre-distorter having a unity transfer function is located between a signal input and the input of the inherently non-linear device. Furthermore a second device forming a post-distorter is coupled to the output of the nonlinear device in a way to be able to handle the amplified output signal or a portion of the output signal. According to the present method the post-distorter is optimized to give as output the same signal spectrum content as what is input to the non-linear device, whereafter the achieved parameters of the post-distorter are transferred to the pre-distorter. In other words a copy of the optimized post-distorter is then used as a pre-distorter in front of the non-linear device to obtain an improved output signal in terms of signal quality from the inherently non-linear device. The post-distorter is then optimized once more and parameters are again transferred to the pre-distorter as a further as a further small correction. In operation this is then generally repeated in a suitable scheduled way to give an ongoing correction to the pre-distortion. The pre-distorter and post-distorter may both be either digital devices or analog devices.

11 Claims, 6 Drawing Sheets

$L2[L1(x)] = x$ $L1[L2(x)] = y$ $L1[L2(x)] = L2^{-1}[L2(x)] = y$ $x = PD[PA(x)]$ $x = PA[PD(x)]$

PRE-DISTORTION OF NON-LINEAR DEVICES BY POST-DETECTION

This application is a continuation of international application PCT/SE01/02628 filed 8 Nov. 2001 which designates the U.S.

TECHNICAL FIELD

The present invention relates to utilization of pre-distortion as a means to linearize inherently non-linear devices by using post-detection.

BACKGROUND

As wireless communication expands in terms of more and more users in the networks, the number of frequency carriers in a given area also has to be increased to maintain a certain degree of service. This means that Radio Frequency (RF) combining also has to be improved in order not to loose too much power. Combining carriers the classic way means a large ladder of 3-dB combiners with in the end a very low efficiency.

Another way to combine a large number of carriers is to combine at digital base-band or at some intermediate frequency at low signal power. The combined signal can then be jointly amplified using a broadband multi carrier power amplifier (MCPA).

A way of improving performance of MCPA's other than directly improving the linearity of for example transistors is to place a pre-distorter in front of the amplifier. There are a number of ways as how to accomplish this. One way is to pre-distort within MCPA itself. Usually this is done in an analog RF fashion. Such a solution is demonstrated for instance by U.S. Pat. No. 5,126,687. RF pre-distortion (PD) may also be done outside the full MCPA. Numerous documents are found describing different solution using pre-distortion. For instance JP, A, 01-314439 and JP, A, 59-017736 illustrates usage of pre-distorters.

Another way is to implement digital pre-distortion. Digital PD may be used whenever there is a digital combined signal at hand. For instance U.S. Pat. No. 6,072,364 illustrates such a digital solution The introduction of so-called software transceivers makes it possible to extract exactly this signal. On a system-level there would be a digital software transceiver, a broadband digital-to-analog converter (DAC), some RF hardware and the RF MCPA basically connected to the antenna port through an antenna feed cable. A digital pre-distorter would preferably be placed between the software transceiver and the DAC.

State-of-the-art of implementing pre-distorter is still in its cradle. Usually the technique is to enforce that the pre-distorter inherently reflects the nonlinear behavior of the MCPA itself. The details of the distortion curve are determined by a set of parameters, which may vary from model to model. The actual functionality of the pre-distorter is then to "bend" the non-linear curve the other way such as to counter-act the non-linear device.

The means of computing the parameters of the pre-distorter is usually to compare the input signal to the output signal, and then by some manner adjust the parameters in such a way as to minimize distortion at the output of the non-linear device. Usually this means a careful time or phase alignment of input-to-output signals, which makes it a difficult task to actually implement.

Moreover, it usually involves some sort of modeling of the pre-distorter in conjunction with the MCPA itself. In this way, the optimization procedure is somewhat two-fold in that it needs modeling of two items within the iteration procedure. It would be expected that the iteration process gets rather involved and also takes time to perform.

Therefore there is still a demand of an alternative method which may simplify the procedure of modeling the distortion compensation in conjunction with the MCPA itself avoiding the careful time or phase alignment of input-to-output signals, which normally makes a feed-back solution a difficult task to actually implement.

SUMMARY OF THE INVENTION

This present invention disclosure proposes a new way to calculate and optimize the pre-distorter that avoids the need to time-align between input and output of the MCPA. That is, the analog output spectrum is used directly to compute an optimum pre-distorter. Another way is to use both input and output signals for the optimization of the pre-distorter.

Thus, a method and an arrangement is disclosed to by means of a pre-distorter linearizing output from an inherently non-linear device. A pre-distorter having a unity transfer function is located between a signal input and the inherently non-linear device input. Furthermore a second device forming a post-distorter is coupled to the output of the nonlinear device in a way to be able to handle the amplified output signal or a portion of the output signal. In other words a copy of the optimized post-distorter is then used as a pre-distorter in front of the non-linear device to obtain an improved output signal in terms of signal quality from the inherently non-linear device. The post-distorter is then optimized once more and parameters are again transferred to the pre-distorter as a further small correction. In operation this is then generally repeated in a suitable scheduled way to give an ongoing correction to the pre-distortion. The pre-distorter and post-distorter may both be either digital devices or analog devices.

The method according to the present invention is set forth by the independent claim 1 and the dependent claims 2–7 and an arrangement according to the invention is set forth by the independent claim 8 and further embodiments being defined by the dependent claims 9 to 11.

SHORT DESCRIPTION OF THE DRAWINGS

The invention, together with further objects and advantages thereof, may best be understood by making reference to the following description taken together with the accompanying drawings, in which:

FIG. 1 demonstrates that the output spectrum on a non-linear device may be seen as a sum of an input spectrum and an intermodulation spectrum created within the device;

Figure 5:
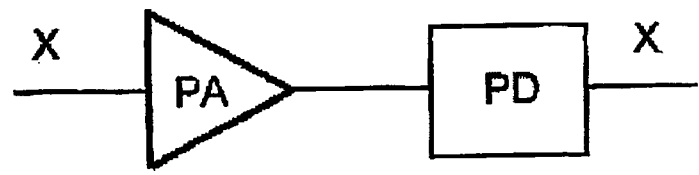
Figure 6:
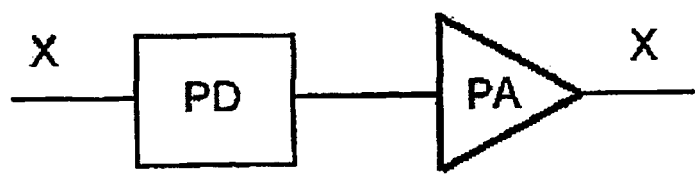
Figure 7:
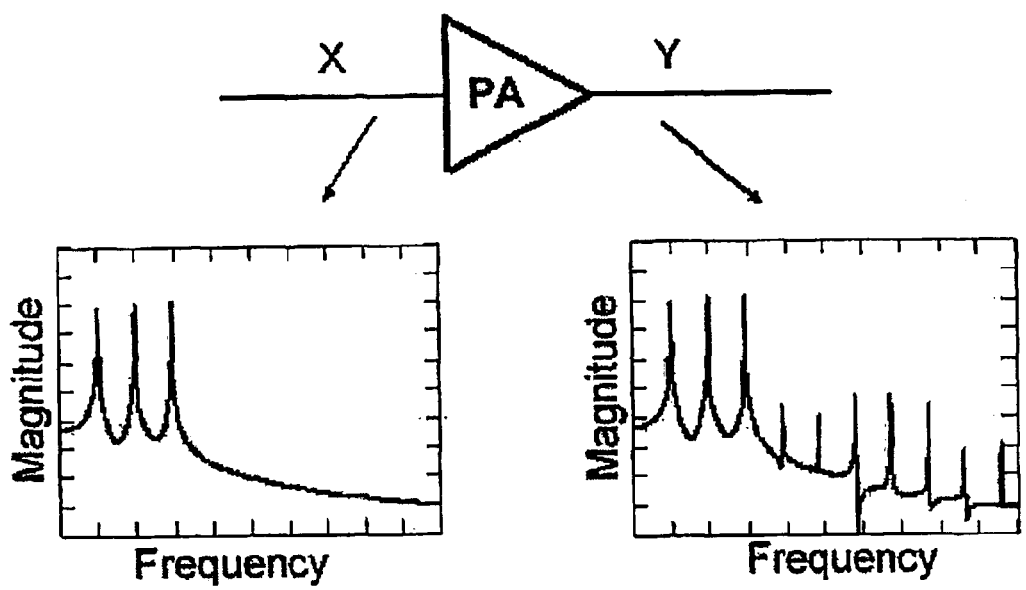
Figure 8:
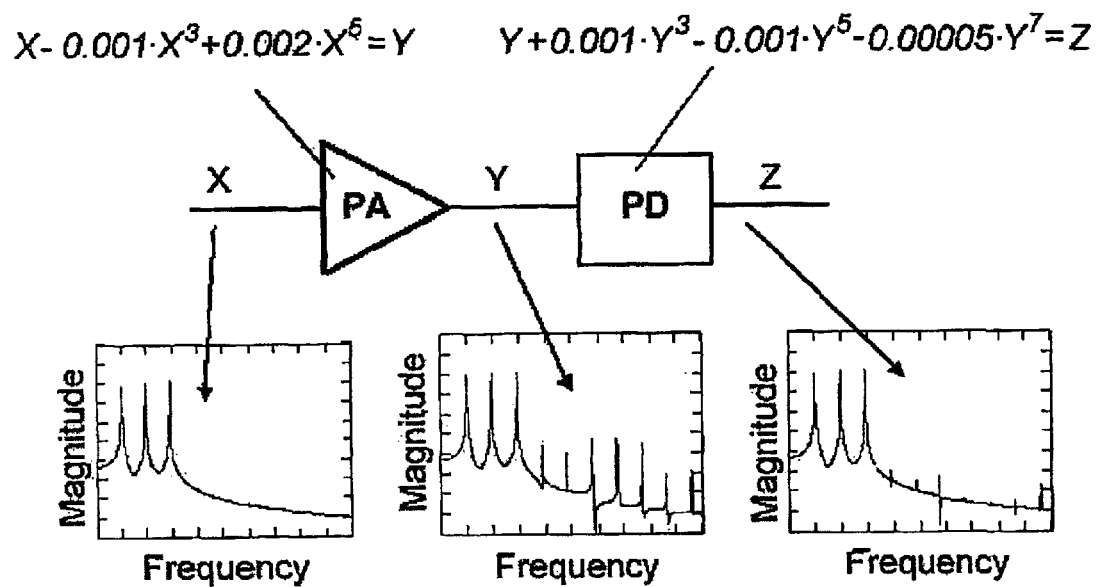
Figure 9:
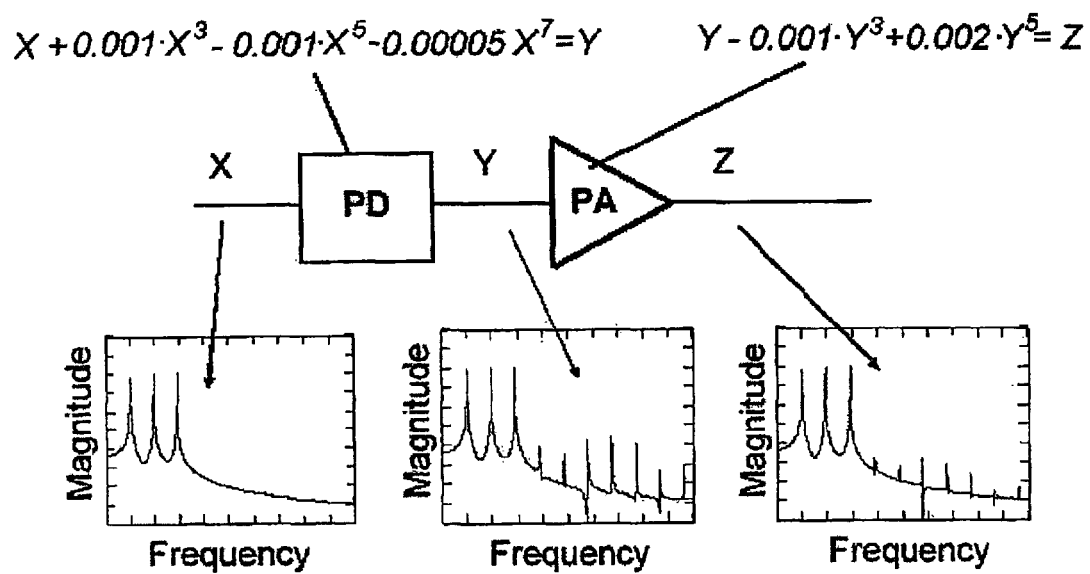
Figure 10:
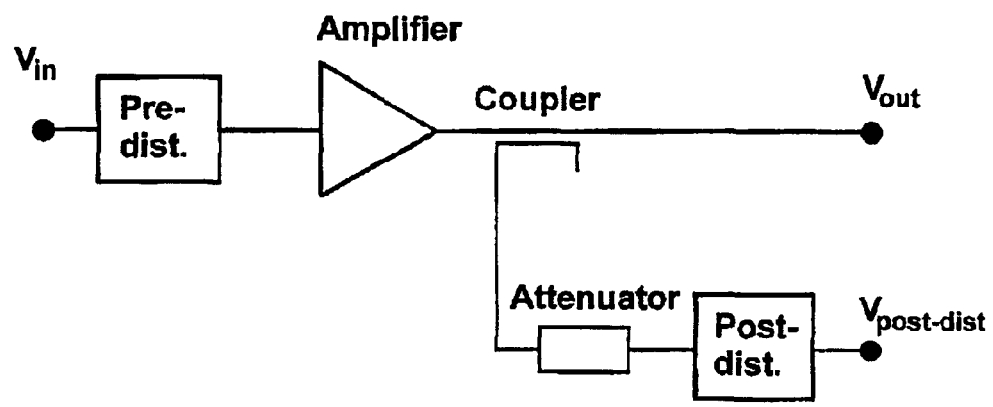

FIG. 5 assumes that a post-distorter is perfect meaning that it gives back the input signal when applied to a non-linear device;

FIG. 6 illustrates that if assumption in FIG. 5 is valid, and by further assuming the existence of inverse operators of PD and PA, then the reverse order of PA and PD is also valid;

FIG. 7 illustrates an example with an indicated non-linear transfer function of a power amplifier PA producing the output spectrum Y for an input signal X;

FIG. 8 illustrates the given non-linear power-amplifier of FIG. 7 with a reasonably good post-distorter to produce the output spectrum Z from an input signal X;

FIG. 9 illustrates in view of FIGS. 7 and 8 a "perfect" post-distorter placed as a pre-distorter to give similar good results;

FIG. 10 illustrates an example of implementation of a post-distorter in accordance with the present invention.

DETAILED DESCRIPTION

The solution to the above problem is proposed as using the output signal directly to optimize such non-linear effects as for example intermodulation performance, rather than trying to match the input signal or spectrum to the output signal or spectrum. That is, the output signal (except for a possible gain constant) can be used as input to the optimization procedure directly. Since the intermodulation products usually are of much lower amplitude than the carriers themselves, it can be taken as the input signal without major loss of confidence. Moreover, it will be proven in this disclosure that post-distorting the power amplifier output signal is equivalent to pre-distorting the input carriers except for some power gain.

Technical Description

It is proposed that instead of using the input signal to a non-linear device trying to match it to the output spectrum or signal by means of a pre-distorter, one can rather use the output signal alone for both the linearizing optimization and for the actual implementation of the pre-distorter. It is proposed that implementing a post-distorter that perfectly achieves linearisation is equivalent to placing the same linearizer at the input of the non-linear device.

This assumption will make it easier to calculate the parameters necessary for the linearization. It avoids the problem of time-aligning the input signal to the output signal. Also, it removes an iteration step in the optimization routine, which must make a model of the non-linear device itself. Using this strategy it is only necessary to calculate a post-distorter that removes unwanted spurious signals from the output of the non-linear device.

Proof of Concept

One of the most basic laws of mathematics is the Commutative law. Invoking this law allows us to perform for example multiplications in the reverse order, i.e. ab=ba. However, it is not always the case that the commutative law is valid. One example of this is in matrix algebra, where multiplication of two matrices AB is not generally equal to BA. This indicates that even if it seems clear and evident to use this particular law, it should be proven in every separate case. Therefore, we proceed to prove it in the case of successive use of operators.

Assume that there exists a Post-Distortion Operator (L2) that exactly can distort an output signal L1(x) from a non-linear device, such that the exact input function (x) to that device is again obtained at the output of the Post-Distortion Operator. Assume further that there exists an inverse operator $L2^{-1}$ to the post-distorter such that when applied to the output-signal from the post-distorter, it gives back the input signal of the post-distorter.

Figure 1:
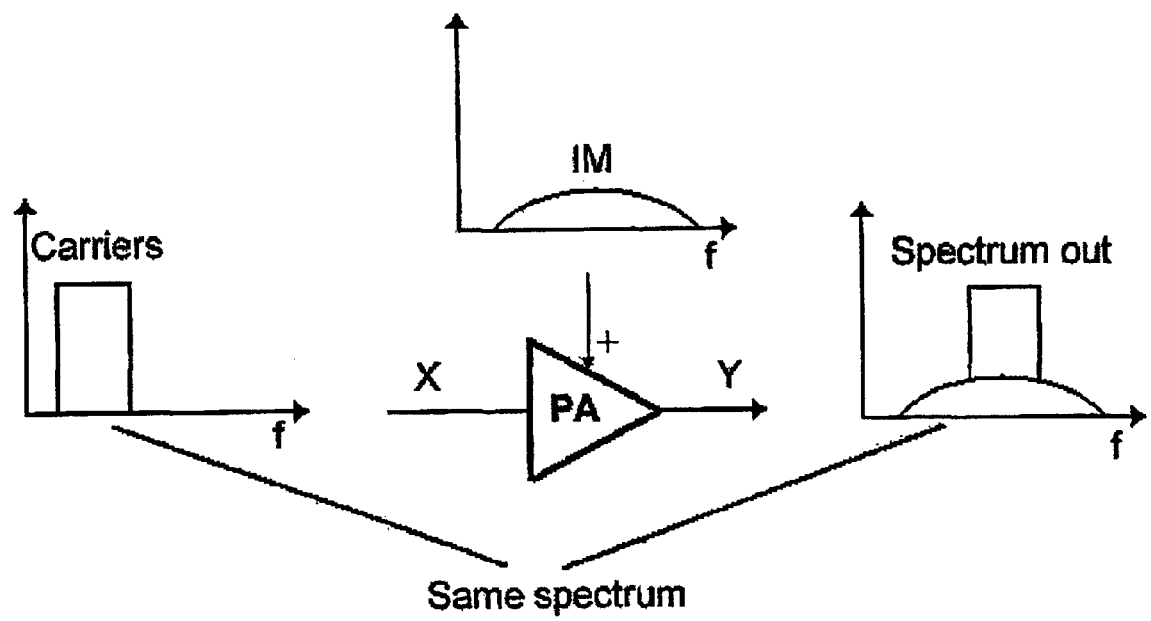
Figure 2:
FIG. 2 illustrates an operator L2 acting on the output of operator L1 as adjoint operator and L2 being the inverse (adjoint) operator of L1.

Consider the block schematics in FIG. 2, which shows the above relationship between two operators L1 and L2. L2 in this case takes on the role of the post-distorter. From the figure and the above mentioned relationship it is evident that the following equation holds:

$$L2[L1(x)]=x \qquad (1)$$

and from this, by operating with the inverse operator $L2^{-1}$ (assumed to exist) on both sides of the equation, it is evident that also the following is true:

$$L1(x)=L2^{-1}(x) \qquad (2)$$

Figure 3:
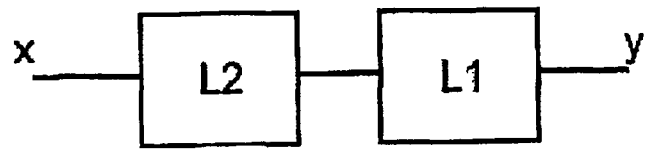
FIG. 3 illustrates operator L1 acting on the output of operator L2 to give an output signal y.

Let us further interchange the two operators in the FIG. 2, and for the moment denote the output signal by "y" to achieve FIG. 3.

Then we have a second equation as:

$$L1[L2(x)]=y \qquad (3)$$

Then from Eq (2) we can further expand Eq (3) such as:

$$L1[L2(x)]=L2^{-1}[L2(x)]=y \qquad (5)$$

which in turn evidently gives that x=y according to:

$$L1[L2(x)]=x=y \qquad (6)$$

Figure 4:
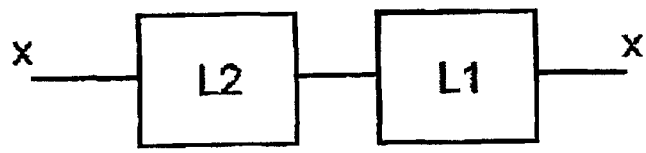
FIG. 4 illustrates operator L1 acting on the output of operator L2, and from the proof of concept it is shown that L1 and L2 are each other's inverse (adjoint) operators.

In block schematics we may visualize it as in FIG. 4. Therefore, we have proven that if given a perfect post-distorter and assuming that there exists an inverse operator to both the post-distorter and to the non-linear device itself, then the post-distorter can be placed unchanged also in front of the non-linear device to achieve the same result.

The block schematic as in FIG. 4 therefore is true for a power amplifier and a perfect distorter. Which, in the light of the above discussion, is equivalent to the original problem where the blocks are interchanged.

The above proof shows that it is possible to use the output signal from a non-linear device and try to optimize non-linearities directly on that signal. Moreover, the resultant post linearizer can then directly be placed in front of the non-linear device. This is more preferable since the input signal is of lower power than the output signal and it is easier to implement a predistorter rather than placing a high-power device at the output of the amplifier.

Now in accordance with FIG. 2, FIG. 5 assumes that a post-distorter PD is perfect meaning that it gives back the input signal X when applied to a non-linear device PA. FIG. 6 then illustrates that if the assumption in FIG. 5 is valid, and by further assuming the existence of inverse operators of PD and PA, then the reverse order of PA and PD is also valid.

EXAMPLE

Assume that we have a power amplifier that has the characteristics as shown in FIG. 7. Given an input signal, it will produce an output spectrum that consists of the input signal spectrum plus some intermodulation or non-linear products. The nature of the intermodulation products is determined by the actual parameters of the non-linearity itself.

Now, the non-linear device as shown in FIG. 7 may be linearized by means of placing some other non-linear device at the output of the amplifier, as shown in FIG. 8. By carefully selecting the parameters of the post-distorter it is possible to largely improve the output signal spectrum in terms of intermodulation or non-linear products. It is not important in this document as how the optimization is performed, rather than that we accept that it is possible. Given the parameters in the figure and the input signal spectrum as shown, the improved output spectrum as shown in the figure is obtained.

Now, it is the object of this discussion to show that the same post-distorter may be placed in front of the non-linear device (acting as power amplifier), and we will still end up with a reasonably good intermodulation result. It should be noted that we have diverted somewhat from the assumption that the post-distorter should be "perfect", but that will merely show as non-perfect intermodulation results. The principal reasoning of the disclosure will still be shown by this example.

As finally shown in FIG. 9 the intermodulation is in the same order as in FIG. 8, but with the post-distorter now placed as a pre-distorter. It is thus shown by both a theoretical discussion and a reasonable example that the proposal of the method is valid.

Practical Implementation

FIG. 10 shows an example of a practical implementation of the Post Distorter. The schematic shows a pre-distorter, amplifier and a coupled device with some attenuation and the post-distorter. The attenuator should be chosen in such a way that the input power level to the post-distorter is the same as to the input side of the MCPA itself. That is the attenuator value should be chosen to the inverse of the MCPA gain. Otherwise corrections have to be made to the parameters such that the input power to the MCPA is maintained.

Assume that initially the pre-distorter has unity transfer function and gain. The post-distorter is optimized to give $V_{postdist}=V_{in}$ with possibly a certain gain or in other words, to give minimum intermodulation products. Next, the post-distorter parameters are transferred to the pre-distorter.

The post distorter then is optimized once more and after that, data is transferred to the pre-distorter as a further small correction. This will be repeated to give an ongoing adaption to the pre-distortion The merit of the invention is that timing and/or phase adjustments between the input of the non-linear device and its output are not necessary. By using the output signal post-distorted by itself, it discloses a straightforward procedure to copy obtained and optimized post-distorter parameters to thereafter act with a corresponding pre-distorter circuitry.

Further it is advantageous to use the output signal directly to determine parameters for the post-distorter since it means that no actual model of the non-linear device itself has to be created. The optimization of the post-distorter may be carried out directly on the output signal, rather than in an off-line manner tracking the input signal through both the pre-distorter and a model of the non-linear device. The arrangement will be valid both for digital as well as analog pre- and post-distorer circuitry. The manner of transferring post-distorter parameters to the pre-distorter can be performed in numerous ways and is not further discussed here as it as such is not considered being a part of the invention, but will be apparent to any person skilled in the art of electronic signaling and circuitry design.

Linearizing an output signal from an inherently non-linear device producing intermodulation products in its output signal as a response to an input signal, in accordance with the present invention, may be embodied in a numerous number of ways without departure from the scope and spirit of the present invention, which is defined by the attached claims.

What is claimed is:

1. A method for linearizing output signals from an inherently non-linear device producing intermodulation or non-linear products in its output signals as response to input signals, characterized by the steps of:

defining and optimizing a post-distorter by post-detection of an output signal of the non-linear device directly to optimize the output signal from the inherently non-linear device to be in accordance with the input signal;

using the actual output signal as input for an optimization procedure directly for canceling intermodulation or non-linear products in the output signal in a post-distortion procedure defining a post-distorter producing a desired removal of the intermodulation or non-linear products in the output signal from the post-distorter, and thereby using a copy of an optimized post-distorter as a pre-distorter in front of the inherently non-linear device to thereby from the inherently non-linear device achieve an improved output signal.

2. The method according to claim 1, characterized by the further steps of setting the pre-distorter to unity transfer function while optimizing the post-distorter for desired removal of the intermodulation or non-linear products at the output signal of the post-distorter;

transferring post-distorter parameters to the pre-distorter and setting then the post-distorter to unity transfer function.

3. The method according to claim 2, characterized by the further steps of optimizing the post-distorter once more and transferring post-distorter parameters to the pre-distorter as a further small correction.

repeating this optimization of the post-distorter on a predefined time scale to obtain a timely correction of the pre-distorter.

4. The method according to claim 1, characterized by the further step of using for the post-distorter a digital device or device model.

5. The method according to claim 4, characterized by the further step of using for the copy of the post-distorter a digital device to serve as a digital pre-distorter.

6. The method according to claim 1, characterized by the further step of using for the post-distorter an analog device or device model.

7. The method according to claim 6, characterized by the further step of using for the copy of the post-distorter an analog device to serve as an analog pre-distorter.

8. An arrangement for by means of a pre-distorter linearizing output from an inherently non-linear device, characterized in a pre-distorter having a unity transfer function inserted between a signal input and an input of the inherently non-linear device;

a second device or device model at an output of the inherently non-linear device by post-detection forming a post-distorter to be optimized by using the output or a portion of the output of the inherently non-linear device, and which post-distorter will be optimized to give as linearization output signal a corresponding signal content as the one which is input to the signal input, whereby obtained post-distorter parameters can be transferred to the pre-distorter to have the pre-distorter compensate for non-linearities of the inherently non-linear device.

9. The arrangement according to claim 8, characterized in that the pre-distorter and the post-distorter is a digital device or a device model.

10. The arrangement according to claim 8, characterized in that the pre-distorter and the post-distorter is an analog device or a device model.

11. The arrangement according to claim 8, characterized in that an attenuator is positioned between a coupler from the output of the inherently non-linear device and the post-distorter.

* * * * *